United States Patent [19]
Urai

[11] Patent Number: 4,905,197
[45] Date of Patent: Feb. 27, 1990

[54] SEMICONDUCTOR MEMORY HAVING CIRCUITRY FOR DISCHARGING A DIGIT LINE BEFORE VERIFYING OPERATION

[75] Inventor: Takahiko Urai, Tokyo, Japan
[73] Assignee: NEC Corporation, Japan
[21] Appl. No.: 262,227
[22] Filed: Oct. 21, 1988

Related U.S. Application Data

[63] Continuation of Ser. No. 840,784, Mar. 18, 1986, abandoned.

[30] Foreign Application Priority Data

Mar. 18, 1985 [JP] Japan .................................. 60-53655

[51] Int. Cl.⁴ ............................................. G11C 11/40
[52] U.S. Cl. .................... 365/204; 365/185; 365/189.06
[58] Field of Search ............... 365/104, 184, 185, 203, 365/204, 230, 189.06, 230.01

[56] References Cited

U.S. PATENT DOCUMENTS 3,765,002 10/1973 Basse ..................................... 365/204
4,301,535 11/1981 McKenny et al. ................... 365/185
4,368,524 1/1983 Nakamura ............................ 365/189
4,677,590 6/1987 Arakawa ............................. 365/185
4,720,816 1/1988 Matsuoka et al. .................. 365/104

FOREIGN PATENT DOCUMENTS 0136170 4/1985 European Pat. Off. ............ 365/185
0114193 9/1981 Japan .................................. 365/185
0158091 9/1982 Japan .................................. 365/104
0117787 7/1984 Japan .................................. 365/204
0061995 4/1985 Japan .................................. 365/104

Primary Examiner—Glenn A. Gossage
Attorney, Agent, or Firm—Laff, Whitesel, Conte & Saret

[57] ABSTRACT

A semiconductor memory having a plurality of programmable memory cells includes discharge circuits for discharging a residual charge which remains on a digital line and a signal line coupling the digit line to a sensing amplifier after a programming of a memory cell is completed. The discharge circuit is coupled to the digit line on the signal line and is activated after the programming is completed. The discharge circuit is inactivated when the programmed data is verified.

4 Claims, 3 Drawing Sheets

SEMICONDUCTOR MEMORY HAVING CIRCUITRY FOR DISCHARGING A DIGIT LINE BEFORE VERIFYING OPERATION

This application is a continuation of application Ser. No. 840,784 filed Mar. 18, 1986, now abandoned.

BACKGROUND OF THE INVENTION

1. FIELD OF THE INVENTION:

The present invention relates to a semiconductor memory device and, more particularly, to a EPROM, which is an "electrically programmable read only memory."

2. DESCRIPTION OF THE PRIOR ART:

A user of the EPROM can write information (such as a program or digital data) into the EPROM. The written information is often checked or verified to ensure its correctness. This checking or verification is performed by a specific operation which is called a "verification operation". For example, binary information is first written into a memory cell by applying a high program voltage to a program terminal of the EPROM. Immediately thereafter, the information is read out, through an output terminal of the EPROM. The read-out information is verified by being compared with the correct information. If the read-out information is correct, the correct information is again written into the cell.

It should be noted that the verification operation is performed at a timing when the information is written into the memory and immediately after the information is written into the memory cell. The programming voltage, which is higher than a normal driving voltage, is applied through a digit line to an addressed memory cell. The written information is also read out of the cell through the digit line and a sense amplifier immediately after the writing operation is completed to the addressed cell.

As described above, the digit line is used for both the writing operation and the verification operation. Since the high programming voltage (e.g., 20V) is applied to the digit line in the writing operation, the digit line is charged to a high potential, in the writing operation. Since this charge remains on the digit line after the writing operation has been completed, the digit line must be discharged before the read out operation. If not, the read-out information would be changed by the charges remaining on the digit line, and no accurate verification would be possible.

In the prior art, the remaining charge (residual charge) is discharged through the memory transistors, before the verification operation. Hence, a long period of time is required between the writing (programming) operation and the verification operation. Further, the memory transistors into which the information has been written have a threshold level which is shifted to a high level, so that the impedance of the memory transistor becomes high. Therefore, the discharge period becomes longer.

In addition, a high voltage is applied to a transistor or transistors connected to the digit line (e.g., a digit line selecting transistor, a program control transistor, or a memory transistor) during the discharge period, because of the high impedance memory transistor. Therefore, there are shortcomings in the prior art because the transistor or transistors connected to the digit line are destroyed by the high voltage. To avoid this destruction, a transistor with a high withstand voltage or a high breakdown voltage is required. However, since such a transistor occupies a large area on a semiconductor chip, it is difficult to form a large capacity memory circuit on the chip.

An object of the present invention is to provide a semiconductor memory device in which a digit line charged by a programming (writing) operation can be discharged at a high speed.

Another object of the present invention is to provide a programmable memory device which can perform a verification operation at a high speed.

Still another object of the present invention is to provide, on a semiconductor chip, a programmable memory device having a large memory capacity and having a smooth verification function.

SUMMARY OF THE INVENTION:

A semiconductor memory device, according to the present invention, comprises means for supplying a program voltage to a memory transistor via a digit line coupled to the memory transistor. A sensing amplifier is coupled via a signal line to the digit line. An output is derived from the sensing amplifier and the charge on the digit line and the signal line is discharged. The discharging means is activated after the writing operation is completed. The verification operation is executed after the charge on the digit line and the signal line is discharged by the discharging means. When a transistor is employed as the discharging means, one end of the transistor is coupled to the digit line and/or the signal line. The other end of the transistor is coupled to a discharge source, such as a ground potential. A control signal is applied to the gate of the discharging transistor during a predetermined time period after the writing operation is completed. Thus, the discharging transistor is turned on and the charge on the digit line and the signal line is discharged, during a short period of time.

According to the present invention, after an information is written into an addressed memory cell, by using the program voltage supplying means, the digit line coupled to the addressed memory cell is electrically coupled via the discharging means to the discharge source (a fixed potential). Therefore, a residual charge on the digit line and the signal line is discharged, with certainty, at a high speed. Consequently, the information written into the memory cell is derived from the output means without being destroyed. Hence, an accurate verification can be performed during a short period of time.

Figure 1:
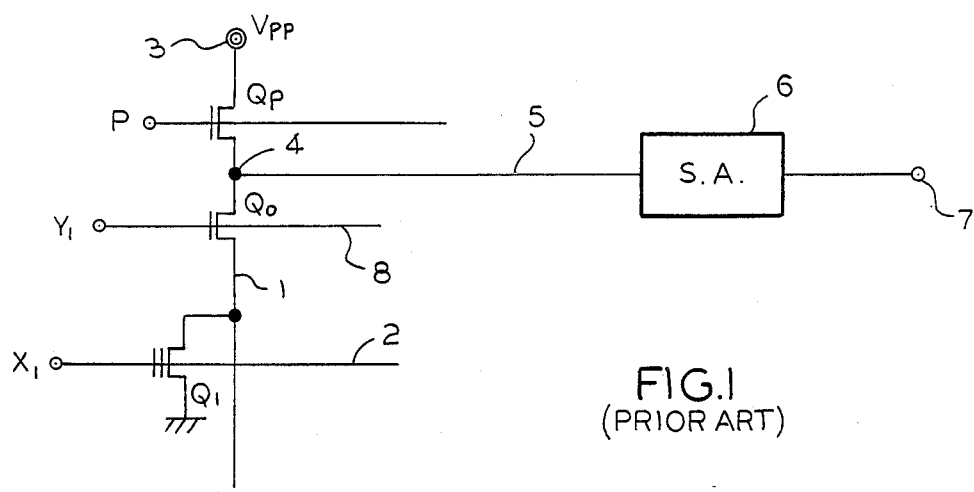
FIG. 1 shows a circuit diagram of a part in the prior art memory device.

DETAILED DESCRIPTION OF THE EMBODIMENTS:

A conventional memory device is illustrated in FIG. 1.

This figure shows one memory cell transistor $Q_1$, a programming circuit for writing an information into the memory cell $Q_1$, and a reading circuit for reading the written information out of the memory cell $Q_1$. One end (e.g., the source) of the cell $Q_1$ is connected to a ground. The other end (e.g., the drain) is connected to a digit line 1. A control gate of the cell $Q_1$ is coupled to a word line 2.

In general, a plurality of memory cells (not shown) are connected, in parallel, to the digit line 1. The control gates of another plurality of memory transistors (not shown) are connected to the word line 2. A plurality of digit lines and word lines (not shown) are also provided to form a memory cell matrix. The digit line 1 is coupled to a program control transistor $Q_p$, via a digit selecting transistor $Q_o$. The gate of transistor $Q_o$ receives a digit line selecting signal $Y_1$ which is the output from a Y decoder which is used for decoding a lower bit portion of an address signal. An upper bit portion of the address is decoded by an X decoder and is applied to the respective word line, as a word selecting signal, e.g., $X_1$.

The program control transistor $Q_p$ is connected to a terminal 3 at which a high programming voltage $V_{pp}$ (e.g., 20V) is supplied. A signal line 5 is connected to the digit line 1 at a node 4 and is connected to an input end of a sensing amplifier 6. An output end of the sensing amplifier 6 is coupled to an output terminal 7.

In a programming (write) operation, an address designating the memory cell $Q_1$ is applied to the memory device. According to the address, the word selecting signal $X_1$ and the digit selecting signal $Y_1$ are applied to the cell $Q_1$ and to the transistor $Q_o$, respectively. During the programming period, these signals $X_1$ and $Y_1$ are boosted to the program voltage $V_{pp}$ and are applied to the cell $Q_1$ and the transistor $Q_o$, respectively.

When an information which is to be written into the cell $Q_1$ is "0", a program control signal P becomes the program voltage $V_{pp}$, to make the transistor turn on. Thus, the high programming voltage $V_{pp}$ is supplied via the digit line 1 to the cell $Q_1$. As a result, a required charge is stored in a floating gate of the cell $Q_1$. The threshold level of the cell $Q_1$ is shifted to a higher level. This condition corresponds to the state where the data "0" is written into the cell $Q_1$.

On the other hand, when a data "1" is written into the cell $Q_1$, the program control signal P is inactivated. Thus, the cell $Q_1$ is electrically decoupled from the program voltage terminal 3. At this condition, no charge is stored in the floating gate of the cell $Q_1$. Hence, the data "1" is written into the cell $Q_1$. In this programming operation, the charge to be stored in the cell may be either electrons or holes.

After the programming of the cell $Q_1$ is completed, the verification operation is executed. In this operation, a reading mode is indicated to the memory device. The program control transistor $Q_p$ is turned off. Thus, the digit line 1 and the signal line 5 are decoupled from the program voltage terminal 3. Further, the word signal $X_1$ and the digit signal $Y_1$ are changed from the program voltage $V_{pp}$ level to a normal driving voltage $V_{cc}$ ($V_{pp} > V_{cc}$) level. Thus, the verification mode is indicated.

The sensing amplifier 6 contains a current source and applies a driving current through the signal line 5, and the digit line 1, to the cell $Q_1$. If the data "0" was written into the cell $Q_1$, a transistor of the cell $Q_1$ is turned off because it has a high threshold level. Therefore, the driving current does not flow. The sensing amplifier 6 detects this state of the current flow and gives an output of the data "0" to the output terminal 7.

On the other hand, if the data "1" was written into the cell $Q_1$, the transistor of the cell $Q_1$ is turned on. As a result, the driving current from the sensing amplifier 6 flows to the ground through the cell $Q_1$. The sensing amplifier 6 detects this state and outputs the data "1" to the output terminal 7. In this case, a current amplification circuit (such as a current mirror circuit or a differential amplification circuit) is employed as the sensing amplifier 6.

According to the above-mentioned read operation, the data written into the cell $Q_1$ is verified. However, the charge to be supplied to the cell $Q_1$ during the writing operation still remains on the digit line 1 and the signal line 5 after the writing is completed. In the prior art, the remaining (residual) charge is discharged through the cell $Q_1$ to the ground. Therefore, a long time is required to discharge the residual charge. Hence, in this prior art circuit of FIG. 1, the verification operation cannot be performed at a high speed.

In addition, if the program control transistor $Q_p$ is turned off after the word signal $X_1$ and the digit signal $Y_1$ is changed from the $V_{pp}$ level to the driving $V_{cc}$ level, an undesirable charge is supplied to both the digit line 1 and the signal line 5. Further, since the threshold level of the memory cell $Q_1$ is shifted at a high level, the impedance of the cell $Q_1$ becomes high. At this condition, if the large amount of the charge is supplied at the node 4 for an undesired period, the potential at the node 4 rises rapidly. Consequently, the transistors $Q_o$, $Q_1$ and $Q_p$ are destroyed which is worse. To avoid this destruction, a transistor must be employed which is able to withstand a high voltage. However, this type transistor requires a large area on the semiconductor chip.

Figure 2:
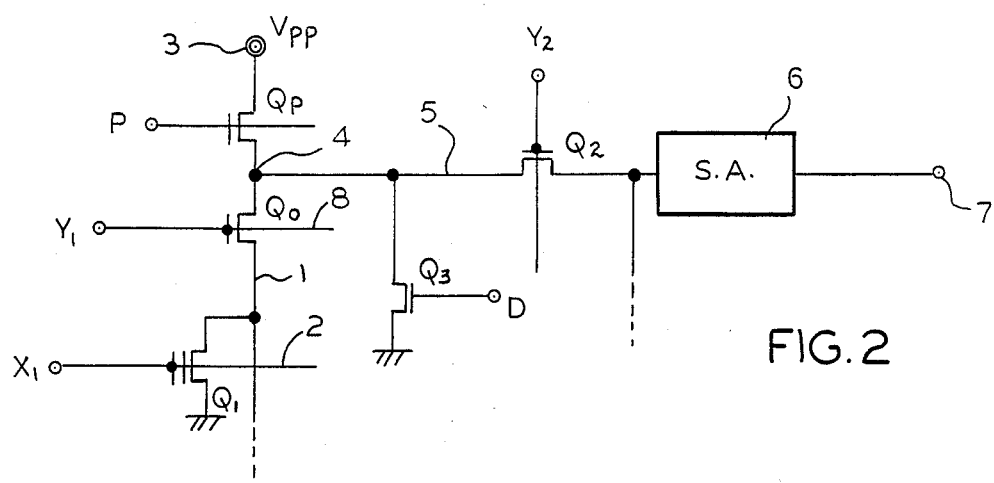
FIG. 2 shows a circuit diagram of an essential part in an embodiment according to the memory device of the present invention.

FIG. 2 shows a circuit diagram of an essential part in the memory device, according to an embodiment of the present invention. In FIG. 2, the digit line 1, the memory cell $Q_1$, the digit selecting transistor $Q_o$, the program control transistor $Q_p$, the program voltage supplying terminal 3, the signal line 5, the sensing amplifier 6, and the output terminal 7 may be the same as in the circuit of FIG. 1.

It should be noted that a transistor $Q_3$ is provided in this embodiment of the invention. One end of the transistor $Q_3$ is connected to the signal line 5, while the other end is connected to ground. A gate of the transistor $Q_3$ receives a control signal D, which will be described later. The transistor $Q_3$ is turned on during the period while a control signal D is applied thereto, whereby the charge on the signal line 5 and the digit line 1 is discharged therethrough to the ground.

A coupling transistor $Q_2$ coupling is provided in the signal line 5, which is connected to the sensing amplifier 6. Transistor $Q_2$ operatively couples the digit line 1 to the sensing amplifier 6, in response to a $Y_2$ signal, which is generated by the Y decoder. This transistor $Q_2$ is effective in the case where a group of digit lines are coupled in common to the node 4, via respective digit-selection transistors and where a plurality of digit line groups are selectively coupled to the sensing amplifier 6. Only one digit line group is electrically coupled to the sensing amplifier 6 via transistor $Q_2$. If the digit lines are not grouped, the transistor $Q_2$ may be omitted.

Figure 3:
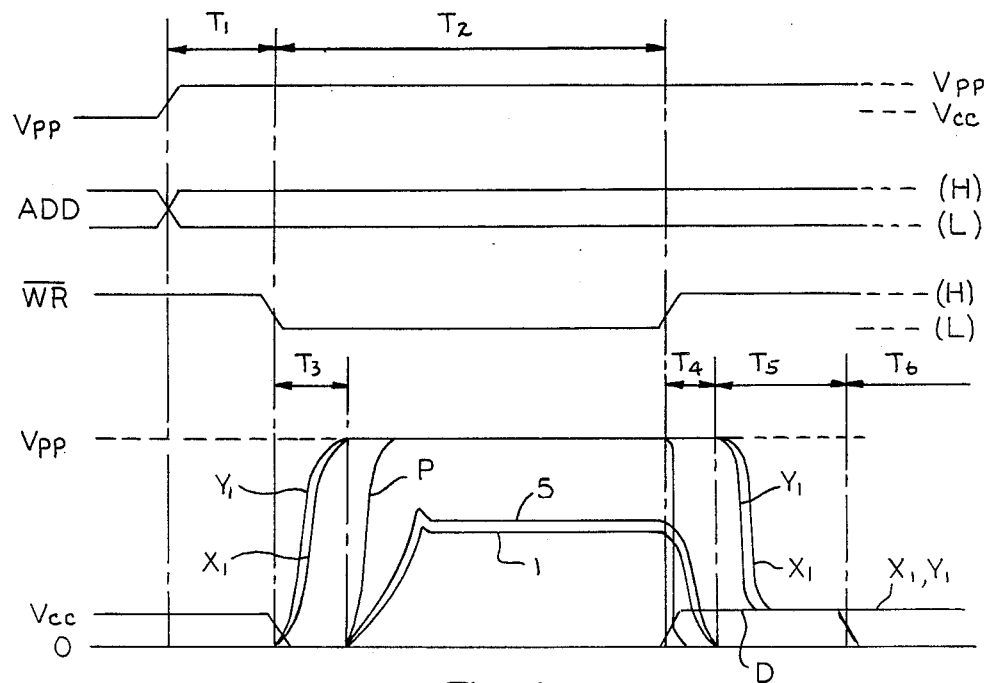
FIG. 3 illustrates a timing chart of the memory device shown in FIG. 2.

Referring to FIG. 3, the programming and the verification operations will be described. First, the high program voltage $V_{pp}$ (e.g., 20V) is supplied at the terminal 3 (FIG. 2) during the programming operation. Instead of supplying the high program voltage $V_{pp}$ from outside the circuit of FIG. 2, a boost circuit is used on the memory chip to produce the high program voltage $V_{pp}$.

An address signal (ADD) selects the memory cell $Q_1$ when it is applied to the memory chip. The address is decoded by a decoder (not shown) during a time period $T_l$. Further, a writing control signal WR becomes an active level (e.g., a low level) according to the programming mode during a period $T_2$. In this period $T_2$, the word signal $X_1$ and the digit signal $Y_1$ become the programming voltage $V_{pp}$ level (e.g., 20V) within a period $T_3$. Further, the program control signal P becomes the programming voltage $V_{pp}$ (e.g., 20V) when the data "0" is to be written into the cell $Q_1$.

Since the program control transistor $Q_p$ is turned on, the programming voltage $V_{pp}$ is supplied to the cell $Q_1$ via the digit line 1. Thus, the cell $Q_1$ stores charges in the floating gate and the threshold level is shifted to a high level.

When the programming is completed, the period $T_2$ is terminated. Within this period $T_2$, the digit line 1 and the signal line 5 are charged, as shown in FIG. 3. Thereafter, the program control signal P is switched off in a period $T_4$. Further, the word signal $X_1$ and the digit signal $Y_1$ are changed from the $V_{pp}$ level to a normal driving voltage $V_{cc}$ (e.g., 5V) level in a period $T_5$.

It is to be noted that the charge is held on the digit line 1 and the signal line 5 as the residual charge after the programming is completed. According to the prior art, the residual charge is discharged through the memory cell $Q_1$, so that a quick discharge is not obtained.

In the inventive embodiment, after the programming is completed, the control signal D is immediately activated during the period $T_4$. In other words, the control signal D is applied to the transistor $Q_3$ in synchronization with the timing when the program control transistor $Q_p$ is switched off. Consequently, the transistor $Q_3$ is turned on in the period $T_4$. Thus, the residual charge on the digit line 1 and the signal line 5 is rapidly discharged through transistor $Q_3$ in the period $T_4$, as shown in FIG. 3. Here, it should be noted that the word signal $X_1$ and the digit signal $Y_1$ are held at the $V_{pp}$ level during the period $T_4$.

In the period $T_4$, that is during the discharge period, the word and digit signals $X_1$ and $Y_1$ are held at the $V_{pp}$ level. A part of the residual charge is discharged through the memory cell $Q_1$, so that the discharge speed is increased. This is the reason why the word and digit signals $X_1$ and $Y_1$ are held at the $V_{pp}$ level throughout the period $T_4$. However, if enough of the residual charge can be discharged through the transistor $Q_3$, the word signal $X_1$ and the digit signal $Y_1$ may be changed to the $V_{cc}$ level either when the control signal D is activated or when the program control signal P is switched off. In any case, the change in the word and digit signals may be controlled, roughly.

When the discharge is completed, the control signal D is deactivated to enable the verification operation. In FIG. 3, since the word signal $X_1$ and the digit signal $Y_1$ are changed in the period $T_5$, the verification operation is assigned to a period $T_6$. Under this verification operation, the selecting condition is maintained by the high levels (the normal driving voltage $V_{cc}$, e.g., 5V) of the word signal $X_1$ and the digit signal $Y_1$.

Therefore, the sensing amplifier 6 detects the data stored in the cell $Q_1$ by determining whether a current flows therethrough. At this time, if the transistor $Q_2$ is provided, it is turned on by the $Y_2$ signal. Thus, to verify the storage of data in a memory cell, the correctness of the data stored in the cell $Q_1$ can be accurately derived from the output terminal 7, at a high speed.

Further, according to this embodiment, the control signal D may be activated during at least the discharge period, so that its timing control is very easy. With respect to the word signal $X_1$ and the digit signal $Y_1$, their timing controls may be rough, as described above.

Figure 4:
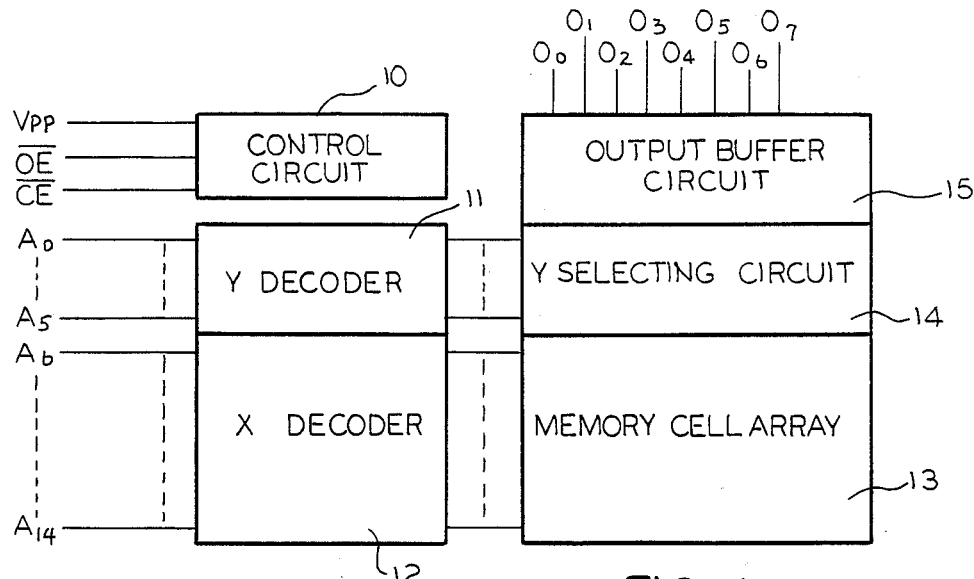
FIG. 4 shows a block diagram of a memory circuit formed on a semiconductor chip according to the present invention.

FIG. 4 shows a block diagram of an ultraviolet erasable and programmable read only memory (UV EPROM) to which the discharge transistor $Q_3$ shown in FIG. 2 is applied. FIG. 4 employs a 15-bit address ($A_0$ to $A_{14}$) and an 8-bit data ($0_0$ to $0_7$)

In response to an address, an 8-bit signal appears in parallel at output terminals $0_0$ to $0_7$. A control circuit 10 receives the program voltage $V_{pp}$, an output enable signal OE (active low) and a chip enable signal CE (active low). Responsive thereto, control circuit 10 produces control signals, such as WR, D, P (FIG. 3).

A lower portion $A_0$ to $A_5$ of the address is decoded by a Y decoder 11 and is applied to a Y selecting circuit 14, as digit selecting signals $Y_1$ and $Y_2$. An upper portion $A_6$ to $A_{14}$ is decoded in an X decoder 12 and is applied to a memory cell array 13, as a word selecting line $X_1$.

One data word (8-bit) is selected by the Y selecting circuit 14 and is output from the output terminals $0_0$ to $0_7$, via an output buffer circuit 15 containing eight sensing amplifiers.

One of the sensing amplifiers (FIG. 5) is a part of the Y selecting circuit 14 and a part of the memory cell array 13. A sensing amplifier 16 is coupled to the output/input terminal $0_0$ and is coupled in common to four blocks $B_0$ to $B_3$.

Figure 5:
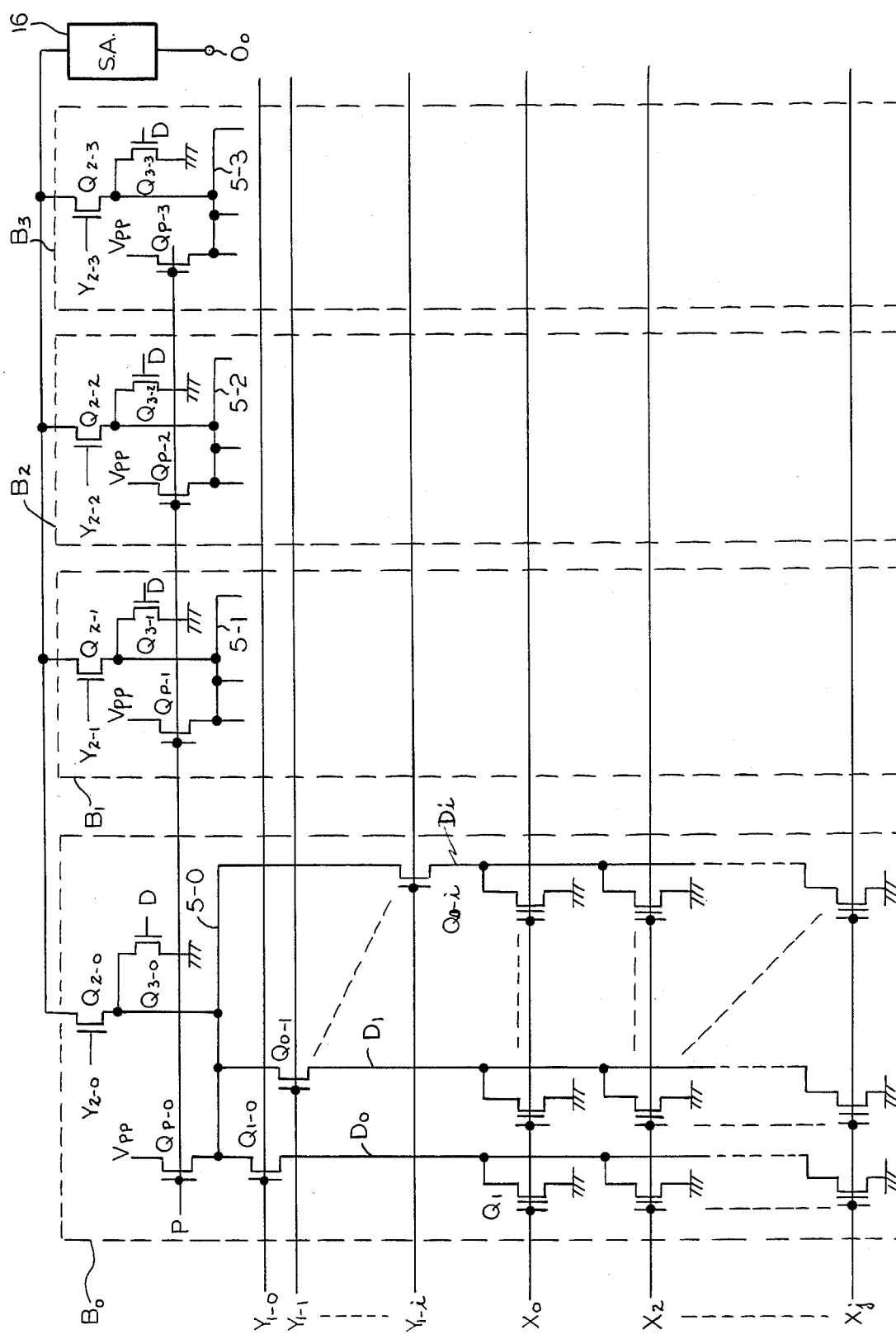
FIG. 5 shows a more detailed circuit diagram of the memory circuit shown in FIG. 4.

The blocks $B_1$ to $B_3$ have a circuit design which is the same as the circuit shown in the block $B_0$ (FIG. 5). As shown in block $B_0$, digit lines $D_o$ to $D_i$ are arranged in parallel and are coupled to the program control transistor $Q_{p-o}$ via digit selecting transistors $Q_{o-o}$ to $Q_{o-i}$, respectively. A plurality of memory cells are connected to each digit line and receive input word signals $X_o$ to $X_y$, respectively.

When the address designating a memory cell $Q_1$ is applied to the chip, the word signal $X_o$ is generated by the X decoder 12 (FIG. 4), while the digit signal $Y_{1-0}$ is generated by the Y decoder 11. Thus, the memory cell $X_1$ is electrically coupled to a signal line 5-0 (FIG. 5) via the digit line $D_o$.

A program control transistor $Q_{p-o}$, a discharge transistor $Q_{3-0}$ and a selecting transistor $Q_{2-0}$ have a circuit design which is the same in the circuit design shown in FIG. 2. One of these four blocks is coupled to the sensing amplifier 16 by means of the selecting transistors $Q_{2-0}$ to $Q_{2-3}$. Only one selecting transistor is turned on in the verification mode and in the normal reading mode in response to an output $Y_{2-0}$ to $Y_{2-3}$ of the Y decoder 11. In this case, the lower two bits $A_0$ and $A_1$ are assigned to select one of the blocks.

As shown in FIG. 5, by coupling the discharge transistors $Q_{3-0}$ to $Q_{3-3}$ to the respective signal lines 5-0 to 5-3, the residual charge on all digit lines $D_o$ to $D_i$ in each block can be discharged through only one switched on transistor in the group $Q_{3\text{-}0}$, $Q_{3\text{-}1}$, $Q_{3\text{-}2}$ or $Q_{3\text{-}3}$. Thus, the required discharge means can be provided in a small chip area and with a small number of transistors. It is, therefore, to be desired that the discharge transistor is connected to either the signal line 5 or a line connecting the digit select transistor $Q_o$ to the program control transistor $Q_p$.

The operation of the EPROM shown in FIGS. 4 and 5 may be the same as the operation of the memory device shown in FIG. 2. Here, with respect to the function of the control circuit 10 (FIG. 4), the explanation will be described in detail, referring to Table 1:

TABLE 1

| MODE | CE | OE | $V_{pp}$ | $O_0$–$O_7$ |
|---|---|---|---|---|
| STANDBY | H | — | $V_{cc}$ | high impedance |
| OUTPUT INHIBIT | L | H | $V_{cc}$ | high impedance |
| PROGRAMMING | L | H | $V_{pp}$ | data input |
| VERIFICATION PROGRAMMING | L | L | $V_{pp}$ | data output |
| INHIBIT | H | — | $V_{pp}$ | high impedance |
| READ | L | L | $V_{cc}$ | data output |

As described in Table 1, six modes are provided in the UV EPROM. In a standby mode, the driving voltage $V_{cc}$ (V5) is supplied to the UV EPROM. However, the chip enable signal CE is inactive, so that the UV EPROM is not selected by a host processor (not shown). At this time, the output enable signal OE is irrelevant. In this standby mode, power consumption is reduced.

In an output inhibit mode, the CE signal is active, while the OE signal is inactive. At this condition, although the UV EPROM is selected, the output buffer circuit is inactivated. Thus, no output operation is performed.

In the programming mode, the CE signal is active, and the OE signal is inactive. However, the program voltage $V_{pp}$ (20V) is supplied at the terminal 3. In response to the program voltage $V_{pp}$, the programming operation is executed during the above-mentioned periods $T_1$ and $T_2$.

In the verification mode, both the CE signal and the OE signal are active. In this condition, the programmed data is read out of the memory cell array 13 (FIG. 4) and is derived from the output terminals $0_0$ to $0_7$ in the period $T_6$.

In a program inhibit mode, the CE signal becomes inactive, so that even if the program voltage $V_{pp}$ is supplied, the programming operation is inhibited.

In a read mode, both the CE and OE signals become active, and the normal driving voltage $V_{cc}$ is supplied to the UV EPROM. In this condition, the data is read out, word by word, according to addresses.

Figure 6:
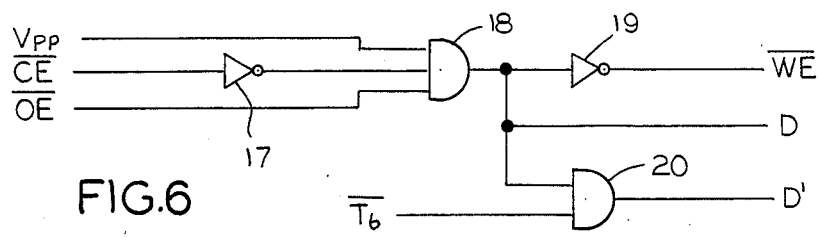
FIG. 6 shows a logic gate diagram of a control circuit shown in FIG. 4.

The programming mode and the verification mode are sequentially executed word by word, according to the switching of the OE signal. The control circuit 10 produces the control signals WR and D in accordance with the CE, OE and $V_{pp}$ signals. For example, the WR and D signals can be produced in FIG. 6 by using inverters 17 and 19 and an AND gate 18. Further, to inhibit the D signal during the verification period $T_6$, an AND gate 20 receiving the D signal and $T_6$ timing signal can be used. The control circuit 10 (FIG. 4) may be constructed by means of logic circuits which are arbitrarily selected at random.

Figure 7:
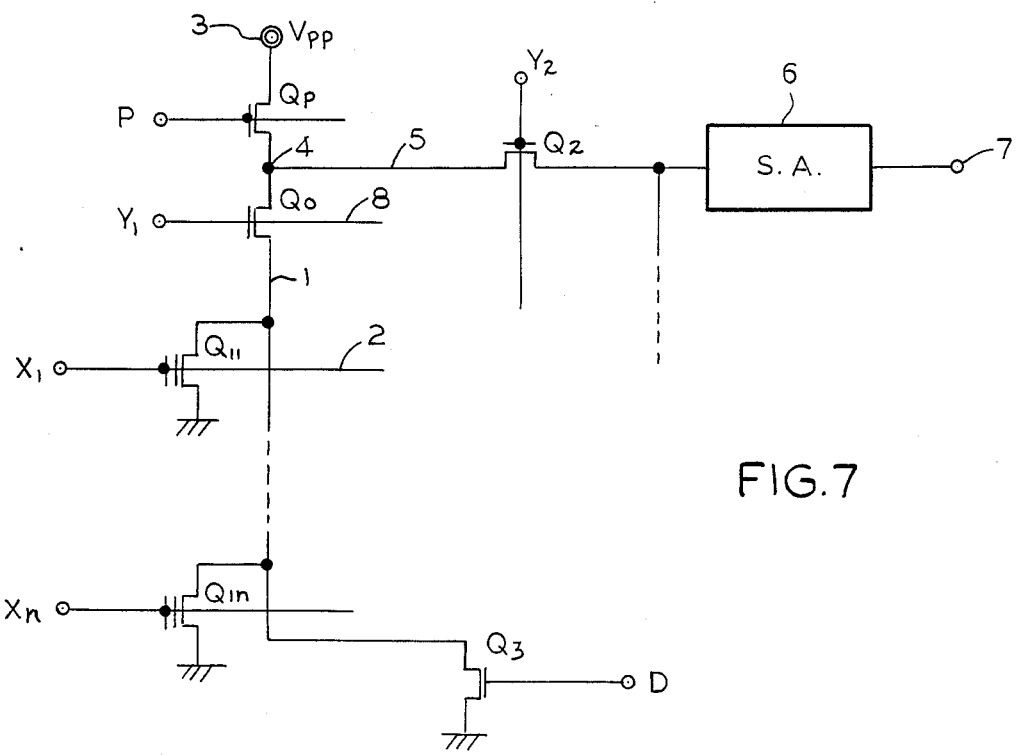
FIG. 7 shows a circuit diagram of another embodiment of the present invention.

FIG. 7 shows a circuit diagram of another embodiment of the present invention. In FIG. 7, the discharge transistor $Q_3$ is connected to the digit line 1 and is activated to discharge the residual charge on the digit line 1 and on the signal line 5. The discharge transistor $Q_3$ may be connected to an arbitrary point on the digit line 1.

In the above-mentioned embodiments, a current amplification circuit may be used as the sensing amplifier 6. However, the sensing amplifier of the present invention can also be an EPROM using a voltage amplification circuit, such as an operational amplifier, a flip-flop type amplifier.

In this case, a precharge transistor is required to preliminarily charge the digit line 1 and the signal line 5 to a predetermined potential before the verification or the normal read operation is performed. In general, one end of the precharge transistor is connected to the digit line 1 or the signal line 5. The other end of the precharge transistor is connected to a precharge source (e.g., 5V). The voltage level of the precharge source is smaller than the voltage level of the programming voltage 20V). Therefore, the precharge transistor is easily destroyed by the charge remaining on the digit line 1 and the signal line 5. The inventive discharge transistor is effective to protect the transistor against this destruction. Here, the precharge operation must be executed after the discharge operation is completed.

Those who are skilled in the art will readily perceive how to modify the invention. Therefore, the appended claims are to be construed to cover all equivalent structures which fall within the true scope and spirit of the invention.

What is claimed is:

1. A programmable read only memory comprising a first terminal supplied with a programming voltage, a second terminal supplied with a reference voltage, a plurality of word lines, a plurality of digit lines, a plurality of memory transistors each having a floating gate, a control gate connected to one of said word lines and a drain-source path connected between one of said digit lines and said second terminal, a circuit node, a plurality of selection lines, a plurality of selecting transistors each having a gate connected to a respective one of said selection lines and a drain-source path connected between said circuit node and a respective one of said digit lines, a program control transistor having a drain-source path connected between said first terminal and said circuit node and a gate, first decoding means responsive to a first set of address signals for energizing one of said word lines, second decoding means responsive to a second set of address signals for energizing one of said selection lines to turn ON the associated one of said selecting transistors for selecting one of said digit lines, means for producing a program control signal during a predetermined period of time, means for supplying said program control signal to the gate of said program control transistor to turn ON said program control transistor and transfer said programming voltage to the selected digit line via said program control transistor and the turned-ON selecting transistor, said selected digit line being charged to a first potential and said circuit node being charged to a second potential which is higher than said first potential during said predetermined period of time, a discharging transistor having a drain-source path connected directly between said circuit node and said second terminal and a gate, means for producing a discharging control signal after said predetermined period of time passes, and means for supplying said discharging control signal to the gate of said discharging transistor to turn ON said discharging transistor, whereby said discharging transistor directly discharges said circuit node and further discharges said selected digit line via said turned-ON selecting transistor.

2. The memory as claimed in claim 1, further comprising a sense amplifier, and means for connecting said circuit node to said sense amplifier.

3. A memory device comprising at least one word line, at least one digit line, at least one memory cell coupled to said at least one word line and said at least one digit line, a circuit node, a selecting transistor connected between said circuit node and said at least one digit line, a terminal supplied with a programming voltage, a program control transistor connected between said terminal and said circuit node, means responsive to address information for energizing said at least one word line and for turning ON said selecting transistor to select said at least one memory cell, means for turning ON said program control transistor during a programming period to supply said programming voltage to said at least one memory cell via said program control transistor, said selecting transistor and said at least one digit line, said at least one digit line being charged by said programming voltage to a first potential and said circuit node being charged by said programming voltage to a second potential that is higher than said first potential, a ground terminal, a discharging transistor having a drain-source path connected directly between said circuit node and said ground terminal and means for turning ON said discharging transistor during a time period when said program control transistor is in a nonconductive state and said selecting transistor is in a conductive state, whereby said discharging transistor directly discharges electric charges at said circuit node and further discharges electric charges at said at least one digit line through said selecting transistor.

4. A semiconductor memory comprising a first terminal supplied with a programming voltage, a second terminal supplied with a reference voltage, a circuit node, a sense amplifier, a signal line connecting said circuit node to said sense amplifier, a program control transistor having a drain-source path connected between said first terminal and said circuit node and a gate, a digit line, a word line, a memory transistor having a floating gate, a control gate connected to said word line and a drain-source path connected between said digit line and said second terminal, a selecting transistor having a drain-source path connected between said circuit node and said digit line, means for supplying to said word line and to the gate of said selecting transistor an active voltage that is substantially equal to said programming voltage, means for supplying said active voltage to the gate of said program control transistor to transfer said programming voltage to said memory transistor via said program control transistor, said selecting transistor and said digit line, said digit line being charged by said programming voltage to a first potential level and said signal line being charged by said programming voltage to a second potential level which is higher than said first potential level, means for changing a voltage of said gate of said program control transistor from said active voltage to an inactive voltage that brings said program control transistor into a nonconductive state while said word line and said gate of said selecting transistor are supplied with said active voltage, a discharging transistor having a drain-source path connected directly between said circuit node and said second terminal and a gate, and means for supplying to the gate of said discharging transistor an energizing voltage that turns ON said discharging transistor during a time period when said program control transistor is in the nonconductive state and said word line and said gate of said selecting transistor are supplied with said active voltage, whereby said discharging transistor directly discharges electrical charges of said signal line and further discharges electrical charges of said digit line through said selecting transistor.

* * * * *